(12) United States Patent
Dennison et al.

(10) Patent No.: US 6,444,520 B1
(45) Date of Patent: Sep. 3, 2002

(54) METHOD OF FORMING DUAL CONDUCTIVE PLUGS

(75) Inventors: Charles H. Dennison; Raymond A. Turi, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 14 days.

(21) Appl. No.: 09/712,176

(22) Filed: Nov. 15, 2000

Related U.S. Application Data

(62) Division of application No. 09/268,737, filed on Mar. 17, 1999, now Pat. No. 6,223,432.

(51) Int. Cl.[7] .......................................... H01L 21/8242
(52) U.S. Cl. ...................... 438/253; 438/629; 438/672
(58) Field of Search .................................. 438/238–240, 438/253–256, 381, 396–399, 618–622, 626–629, 672, 675

(56) References Cited

U.S. PATENT DOCUMENTS

| | | | |
|---|---|---|---|
| 4,502,210 A | 3/1985 | Okumura et al. | |
| 4,650,544 A | 3/1987 | Erb et al. | |
| 4,727,045 A | 2/1988 | Cheung et al. | |
| 4,764,480 A | 8/1988 | Vora | |
| 4,866,009 A | 9/1989 | Matsuda | |
| 4,884,123 A | 11/1989 | Dixit et al. | |
| 4,960,732 A | 10/1990 | Dixit et al. | |
| 4,987,099 A | 1/1991 | Flanner | |
| 5,037,773 A | 8/1991 | Lee et al. | |
| 5,055,427 A | 10/1991 | Haskell | |
| 5,063,175 A | 11/1991 | Broadbent | |
| 5,066,612 A | 11/1991 | Ohba et al. | |
| 5,204,286 A | 4/1993 | Doan | |
| 5,210,053 A | * 5/1993 | Yamagata | ................... 438/620 |
| 5,243,220 A | 9/1993 | Shibata et al. | |
| 5,244,835 A | 9/1993 | Hachiya | |
| 5,283,203 A | 2/1994 | Gill et al. | |
| 5,334,862 A | 8/1994 | Manning et al. | |
| 5,338,700 A | 8/1994 | Dennison et al. | |
| 5,362,666 A | 11/1994 | Dennison | |
| 5,472,912 A | 12/1994 | Miller | |
| 5,413,950 A | 5/1995 | Chen et al. | |
| 5,429,980 A | 7/1995 | Yang et al. | |
| 5,457,065 A | 10/1995 | Huang et al. | |
| 5,489,546 A | 2/1996 | Ahmad et al. | |
| 5,494,841 A | 2/1996 | Dennison et al. | |
| 5,571,733 A | 11/1996 | Wu et al. | |
| 5,616,934 A | 4/1997 | Dennison et al. | |
| 5,637,525 A | 6/1997 | Dennison | |
| 5,651,855 A | 7/1997 | Dennison et al. | |
| 5,680,345 A | 10/1997 | Hsu | |
| 5,686,747 A | 11/1997 | Jost et al. | |
| 5,759,883 A | 6/1998 | Kinoshita | |
| 5,907,788 A | 5/1999 | Kasai | |

OTHER PUBLICATIONS

Abstract for Japanese application 1–248536 dated Oct. 4, 1989.

* cited by examiner

*Primary Examiner*—Jey Tsai
(74) *Attorney, Agent, or Firm*—Dickstein Shapiro Morin & Oshinsky LLP

(57) ABSTRACT

A method of fabricating conductive plugs of different conductive types in contact with different conductivity type semiconductor regions of a semiconductor substrate. The method of the present invention utilizes a simplified two-step masking process and results in a semiconductor device having low resistance conductive plugs of two different conductivity types. The conductive plugs may be formed from conductive materials such as doped polysilicon or refractory metal. If a refractory metal is used, a barrier layer of titanium nitride or titanium oxynitride is used to form the outer layer of the conductive plug.

1 Claim, 6 Drawing Sheets

METHOD OF FORMING DUAL CONDUCTIVE PLUGS

This application is a divisional of application, Ser. No. 09/268,737 filed Mar. 17, 1999, U.S. Pat. No. 6,223,432 the entirety of which is incorporated herein by reference.

FIELD OF THE INVENTION

The present invention relates generally to multi-level conductor integrated circuits wherein the conductors are typically fabricated of either a selected metal or polycrystalline silicon. More particularly, this invention is directed to a self-aligned vertical interconnect process which operates to maximize the achievable packing density within the integrated circuit being manufactured.

BACKGROUND OF THE INVENTION

In many fields of integrated circuit manufacturing, such as in the manufacture of dynamic random access memories (DRAMs), the circuits have multiple levels of metal or polysilicon above the surface of the silicon substrate. These multiple levels must be interconnected for proper electrical functioning of the circuit, and so it becomes necessary to provide certain types of electrical connections between the various conductive levels and active or passive devices.

For example, when DRAMs are fabricated it is customary to provide word lines at one level within the integrated circuit structure and bit or digit lines at another level. It then becomes necessary to provide vertical interconnects between the word and bit lines and certain devices such as access transistors fabricated within the silicon substrate.

A typical structure is illustrated in U.S. Pat. No. 5,338,700, entitled "Method of Forming A Bit Line Over Capacitor Array of Memory Cells", and assigned to Micron Technology, Inc. First, an n-doped polysilicon plug is self-aligned to the transistor gates and word lines. Then, non-self-aligned tungsten plugs are formed to go down to the n-doped plug, the p-doped active area, and the gate interconnect. The tungsten plugs are not self-aligned; accordingly, without careful alignment it is possible that errors in plug placement may result that short the gates and cause electrical errors in the integrated circuit.

A typical method of forming vertical interconnects with a minimum of masking steps is illustrated in U.S. Pat. No. 5,637,525, entitled "Method of Forming a CMOS Circuitry", and assigned to Micron Technology, Inc.

What is needed is a simpler process for producing low resistance conductive plugs that provide vertical interconnects in a semiconductor structure. Also needed is a process that minimizes deep contacts and improves alignment of etching with respect to the gate with a minimum number of masking and etching steps.

SUMMARY OF THE INVENTION

The present invention provides a method for making a semiconductor device with conductive plugs of different conductivity types in contact with the active areas of a semiconductor substrate and the active layers of devices such as transistors. The protective layer of the semiconductor substrate is selectively removed down to a semiconductor region of one conductivity type and to the protective cap of an active device to provide openings that are subsequently filled with conductive material of a first type such as doped polysilicon. Next, the conductive material and the protective layer are selectively removed down to a semiconductor region of an opposite conductivity type, and through the protective cap to the active layer of the active device to provide openings that are subsequently filled with conductive material of a type different than that of the first conductive material such as refractory metal or doped polysilicon of a different type. The conductive materials are then removed from the surface of the protective layer to provide first, second and third conductive plugs in the openings.

Advantages and features of the present invention will be apparent from the following detailed description and drawings which illustrate preferred embodiments of the invention.

DETAILED DESCRIPTION OF THE PREFERRED EMBODIMENTS

Figure 1:
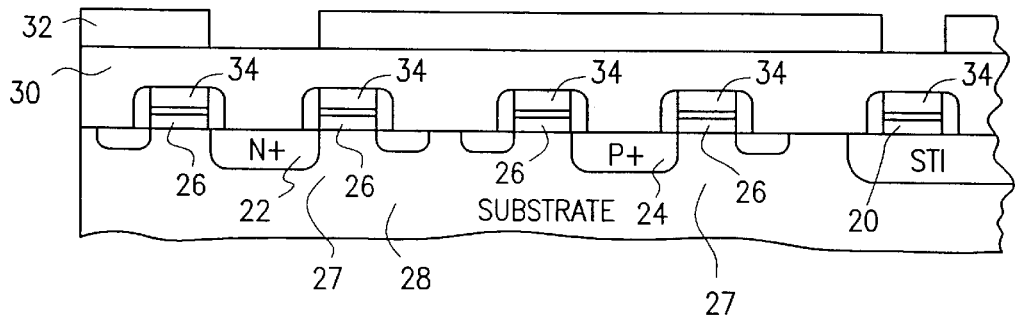
FIG. 1 is a cross-sectional view of a wafer undergoing the process of a preferred embodiment of the invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms wafer or substrate used in the following description include any semiconductor-based structure having an exposed silicon surface in which to form the interconnect structure of this invention. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions or junctions in the base semiconductor structure or foundation.

In addition, although the embodiments of the present invention are described relative to semiconductor memory devices, aspects of the invention are believed to have application to other integrated circuit devices such as programmable arrays or logic arrays. Also, although the embodiments of the invention refer to conductive plugs, similar processes could be used to form interconnects via slots or straps. The following detailed description is, therefore, not to be taken in a limiting sense, and the scope of the present invention is defined by the appended claims.

Referring now to the drawings, where like elements are designated by like reference numerals, an embodiment of the present invention for manufacturing a memory cell array having conductive plugs of two different conductivity types is illustrated by FIGS. 1 through 8. This embodiment uses a process involving two overlapping self-aligned etching steps to produce the conductive plugs of the present invention. The process begins subsequent to the formation of a semiconductor device 10 containing active devices such as gate interconnect 20, with active areas 22, 24 and word lines 26 forming transistors 27 on a silicon substrate 28. A protective layer 30 of a material such as borophosphosilicate glass (BPSG) or silicon dioxide has been formed over the device 10 by chemical vapor deposition (CVD) or other suitable means.

As shown in FIG. 1, the process of the present invention begins by applying a photoresist 32 and mask (not shown), and by using photolithographic techniques to define areas to be etched-out. In this first step, a portion of the protective layer 30 will be removed to expose an active area of a first conductivity type 22, in this case an n-doped active area, and to expose the cap layer 34 of the gate interconnect 20.

Figure 2:
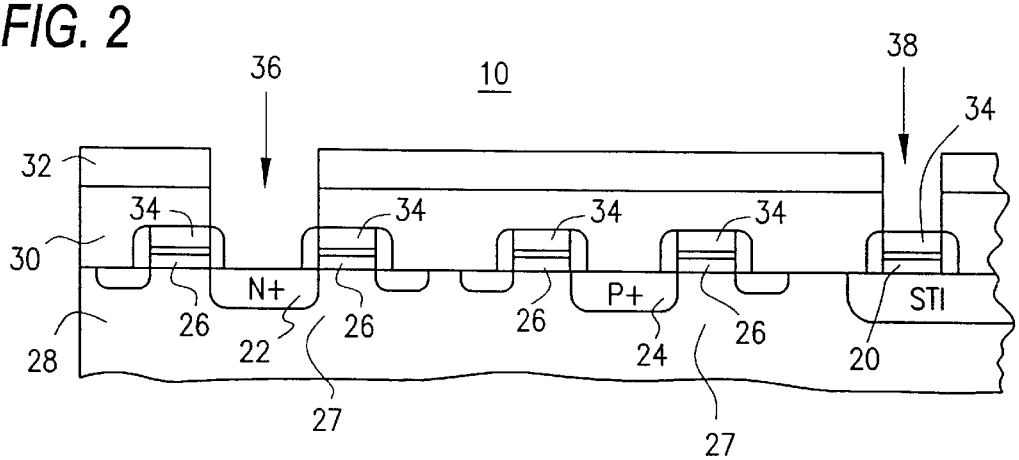
FIG. 2 shows the wafer of FIG. 1 at a processing step subsequent to that shown in FIG. 1.

Referring to FIG. 2, a directional etching process such as reactive ion etching (RIE) is used to etch through the protective layer 30 to form plug openings 36, 38. The etchant used may be any suitable etchant, but it should selectively etch the material of the protective layer 30 and should not etch the active area of the first conductivity type 22, the cap layer 34, or the spacers on the transistors 27.

Figure 3:
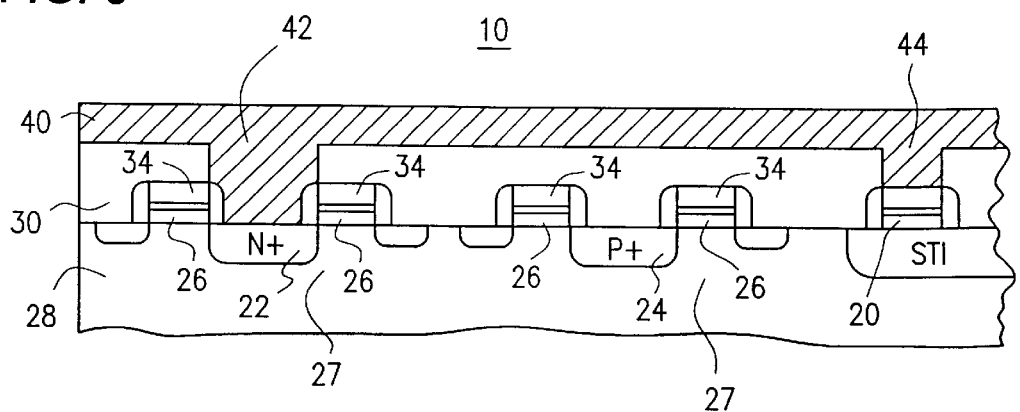
FIG. 3 shows the wafer of FIG. 1 at a processing step subsequent to that shown in FIG. 2.

FIG. 3 depicts the next step, in which the resist is removed and a first conductive layer 40 is formed so that it overlies the protective layer 30, and also fills the plug openings 36, 38, to form plugs 42, 44. The first conductive layer 40 may be formed from a suitable conductive material such as a refractory metal, such as tungsten, or doped polysilicon. If the conductive layer 40 is formed of doped polysilicon, the layer 40 may be doped after deposition, but preferably is doped in-situ. Conductive layer 40 may be deposited by any suitable means such as CVD.

Figure 4:
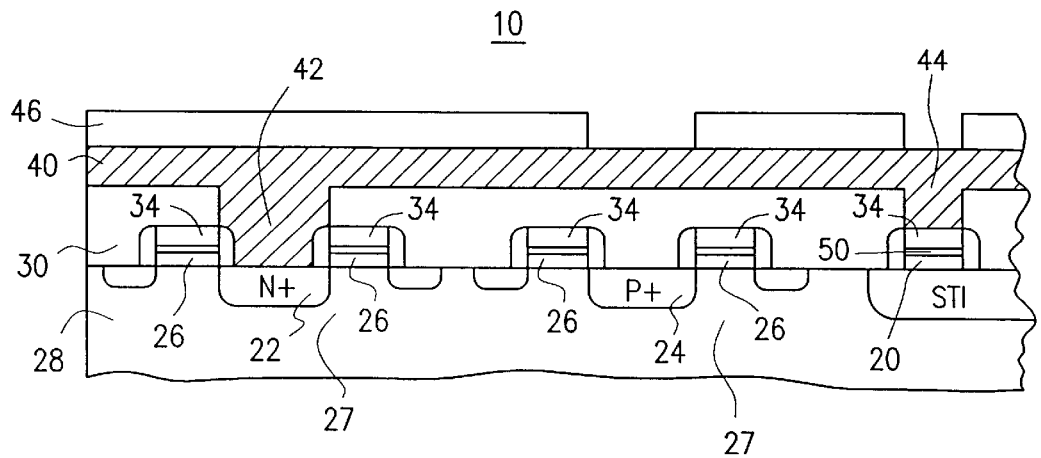
FIG. 4 shows the wafer of FIG. 1 at a processing step subsequent to that shown in FIG. 3.
Figure 5:
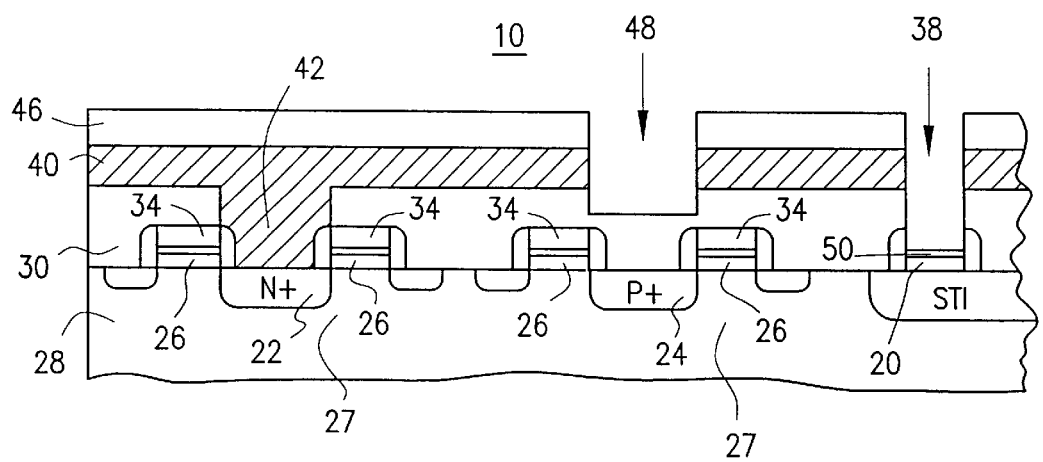
FIG. 5 shows the wafer of FIG. 1 at a processing step subsequent to that shown in FIG. 4.
Figure 6:
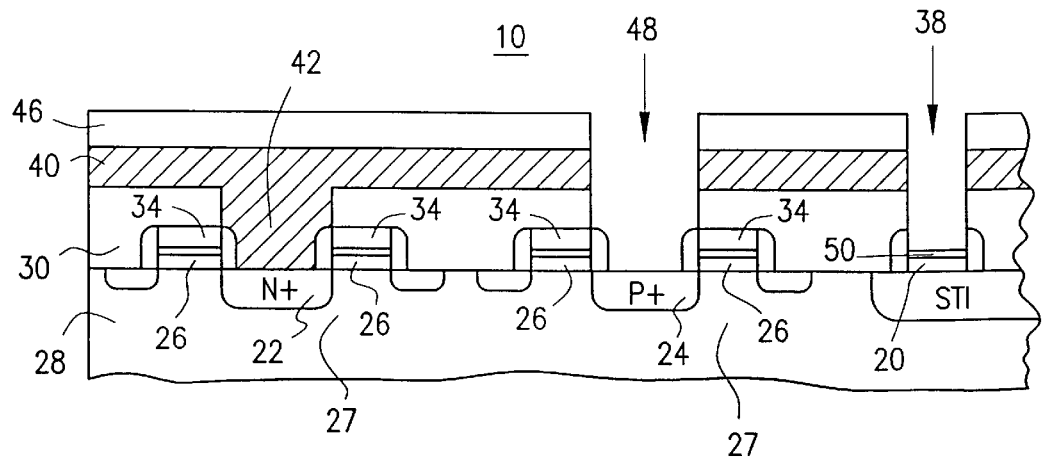
FIG. 6 shows the wafer of FIG. 1 at a processing step subsequent to that shown in FIG. 5.

As shown in FIG. 4, a second photoresist 46 and mask (not shown) are applied, and photolithographic techniques are used to define areas to be etched-out. Referring now to FIG. 5, a directional etching process such as reactive ion etching (RIE) is used to etch through the first conductive layer 40 to form plug opening 48, and to clear out plug opening 38. The etchant used may be any suitable etchant, but it should selectively etch the first conductive layer 40 and not the protective layer 30 or the cap layer 34 of the gate interconnect 20. A non-selective etching process is then performed to remove the cap layer 34, exposing the gate layer 50. Following this process, an additional selective etch is performed to deepen plug opening 48 by removing the protective layer 30 therein and to expose the active area of the second conductivity type 24. The resultant structure is shown in FIG. 6. Optionally a salicide layer may be formed at this stage of the process.

Figure 7:
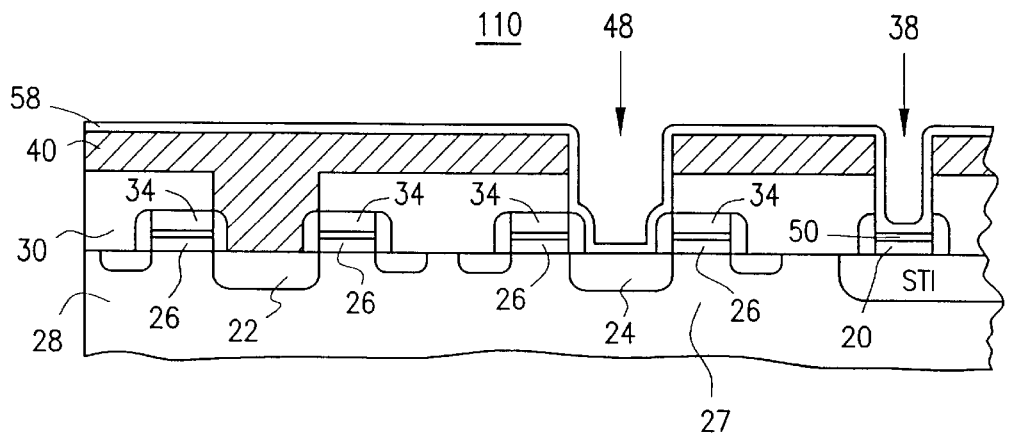
FIG. 7 shows the wafer of FIG. 1 at a processing step subsequent to that shown in FIG. 6.

The resist 32 is then removed as shown in FIG. 7, and a barrier film 58 is formed so that it overlies the protective layer 30, and also forms a thin layer inside plug openings 38, 48. The barrier film 58 may be comprised of titanium nitride or titanium oxynitride, or other suitable material, and varies depending on the material used for the plug. For example, with a refractory metal plug a titanium nitride barrier film is preferred, whereas a plug formed from highly doped polysilicon may be used with or without a barrier film. A barrier film is also used when a plug of one conductivity type (n-type) is made to an active area of the opposite conductivity type (p-type), and vice-versa. The structure then appears as shown in FIG. 7.

Figure 8:
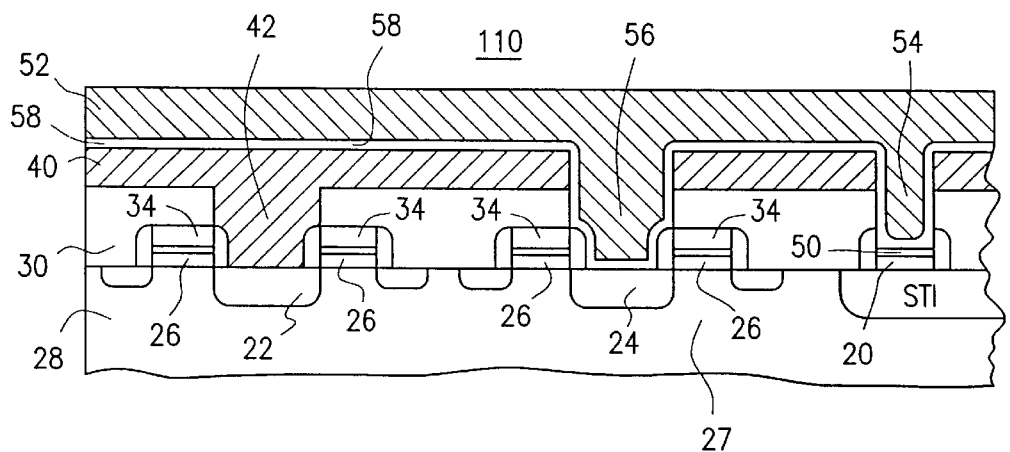
FIG. 8 shows the wafer of FIG. 1 at a processing step subsequent to that shown in FIG. 7.
Figure 9:
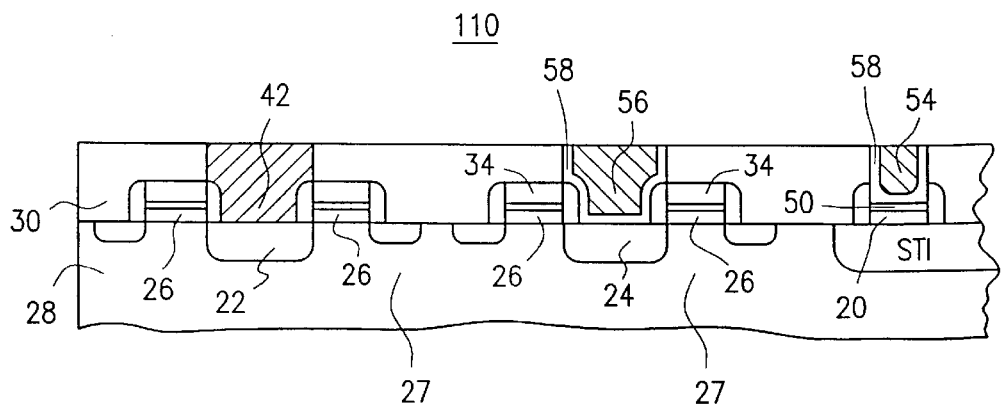
FIG. 9 shows the wafer of FIG. 1 at a processing step subsequent to that shown in FIG. 8.

As shown in FIG. 8, a second conductive layer 52 is then deposited, preferably by CVD, to fill plug openings 38, 48 and form plugs 54, 56. As described above, the second conductive layer 52 may be formed from a suitable conductive material having a conductivity opposite that of the material used to form the first conductive layer 40. If the layer 52 is formed of doped polysilicon, it may be doped before or after deposition, but preferably is doped in-situ. If desired, the semiconductor device 110 may be planarized by CMP or other suitable means at this time. The device 110 now appears as shown in FIG. 9. Further steps to create a functional circuit from the semiconductor device 110 may now be carried out, such as the formation of capacitors (not shown).

Although the process described above begins with the formation of a conductive plug 42 to the active area of a first conductivity type 22, the plug to the active area of the second conductivity type 24 may be formed first. The semiconductor device 10 may also be planarized after formation of the first conductive plug 42, at the stage in the process shown in FIG. 3, to isolate plugs 42, 44 before proceeding with the formation of plugs 54, 56. This optional planarization step may be carried out by CMP or other suitable processes.

Figure 10:
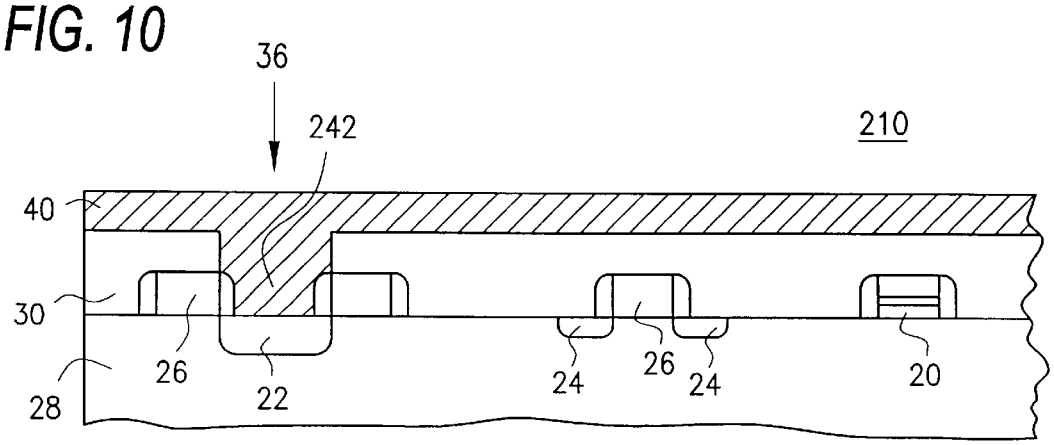
FIG. 10 is a cross-sectional view of a wafer undergoing the process of the second embodiment of the invention.

A second embodiment may be manufactured by a process depicted in FIGS. 10 to 13, and as described below. The second embodiment, while also creating conductive plugs of two different conductivity types, differs from the first embodiment because the two photolithography steps do not overlap. This process difference is preferred in some applications because it is more easily integrated into some existing DRAM fabrication processes. Referring to FIG. 10, a photoresist (not shown) and mask (not shown) are applied to a protective layer 30, and photolithographic techniques are used to define areas to be etched-out. A directional etching process is used to etch through the protective layer 30 to form a plug opening 36. The etchant used may be any suitable etchant.

The resist is then removed, and a first conductive layer 40 is formed so that it overlies the protective layer 30 and also fills plug opening 36 to form plug 242. The first conductive layer 40 may be formed from refractory metal, such as tungsten, or may be formed of doped polysilicon. If the conductive layer 40 is formed of doped polysilicon, the layer 40 may be doped after deposition, but preferably is doped in-situ. Conductive layer 40 may be deposited by any suitable means such as CVD.

Figure 11:
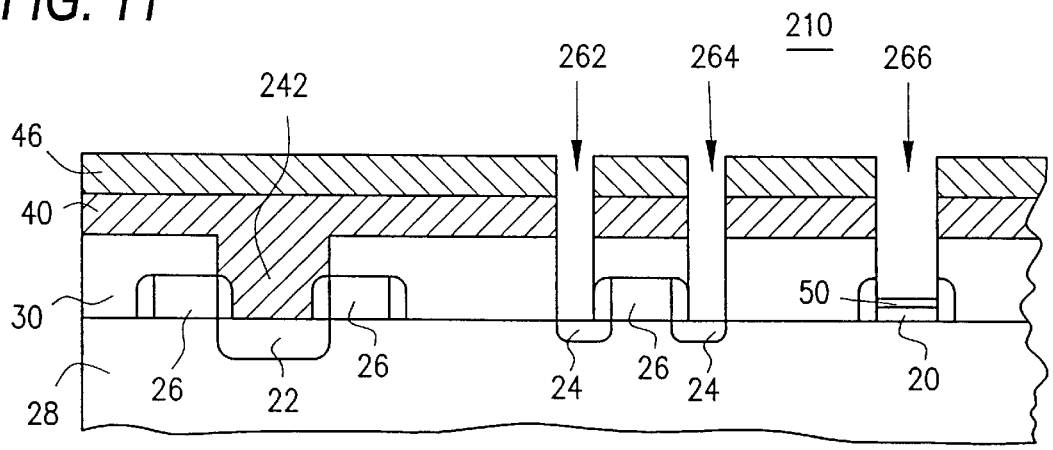
FIG. 11 shows the wafer of FIG. 10 at a processing step subsequent to that shown in FIG. 10.

As shown in FIG. 11, a second photoresist 46 and mask (not shown) are applied, and photolithographic techniques are used to define areas to be etched-out. In this step, portions of the first conductive layer 40 and the protective layer 30 are removed to expose active areas of a second conductivity type 24, creating plug openings 262, 264. The etchant is preferably chosen to also remove the cap layer (not shown) of the gate interconnect 20, creating plug opening 266 and exposing the gate layer 50. The resultant structure is shown in FIG. 11. Optionally a salicide layer may be formed at this stage of the process.

Figure 12:
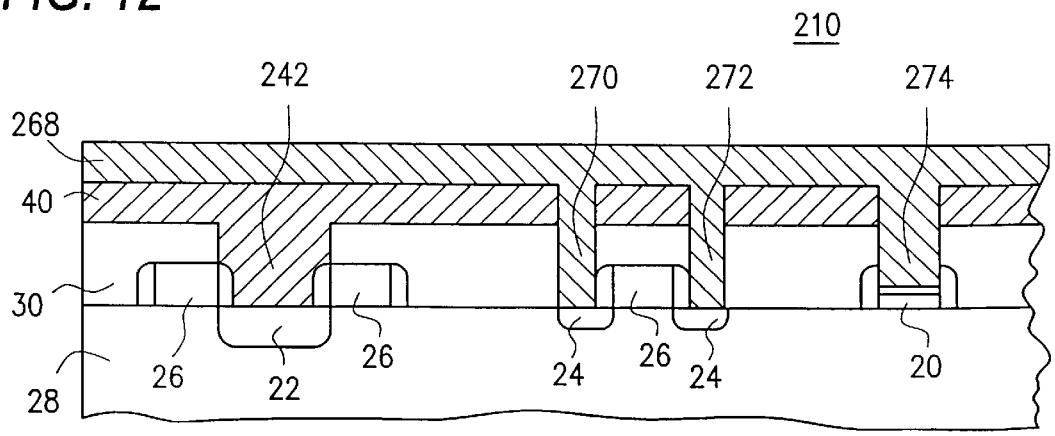
FIG. 12 shows the wafer of FIG. 10 at a processing step subsequent to that shown in FIG. 11.

Referring now to FIG. 12, the resist 46 is then removed and a second conductive layer 268 is formed so that it overlies the conductive layer 40, and also fills the plug openings 262, 264, and 266 to form plugs 270, 272, and 274. The second conductive layer 268 may be formed from suitable conductive materials such as a refractory metal, such as tungsten, or doped polysilicon. If the layer 268 is formed of doped polysilicon, the layer 268 may be doped after deposition, but preferably is doped in-situ. The second conductive layer 268 may again be deposited by any suitable means such as CVD.

The second conductive layer 268 has a conductivity opposite that of the first conductive layer 40. If the first conductive layer 40 is n-doped polysilicon, the second conductive layer 268 could be formed from p-doped polysilicon, a refractory metal, or n-doped polysilicon having a barrier film.

Figure 13:
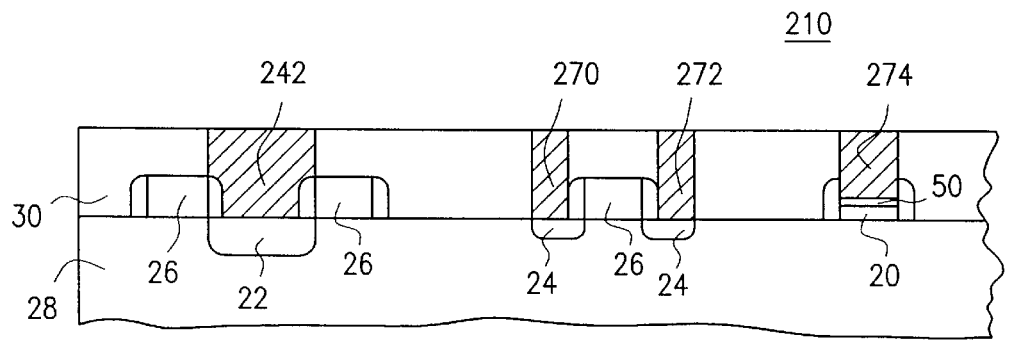
FIG. 13 shows the wafer of FIG. 10 at a processing step subsequent to that shown in FIG. 12.

The surface of the semiconductor device 210 is then planarized, by a method such as CMP, to remove the conductive layers 40, 268 and to isolate the plugs 242, 270, 272, and 274. Other means of isolating the plugs such as a blanket etch-back may be used. The final structure of the semiconductor device 210 is shown in FIG. 13. Further steps to create a functional circuit from the device 210 may now be carried out, such as the formation of capacitors (not shown).

A third embodiment of the present invention is depicted in FIGS. 14 through 18. The third embodiment utilizes the idea of overlapping photolithography steps to form a plug to an active area and a plug to a gate in only two photolithography steps. The complex local interconnect damascene structure produced by the process of the third embodiment normally would require multiple photolithography steps to produce, but the third embodiment presents a simpler and more efficient means for production of the damascene structure.

Figure 14:
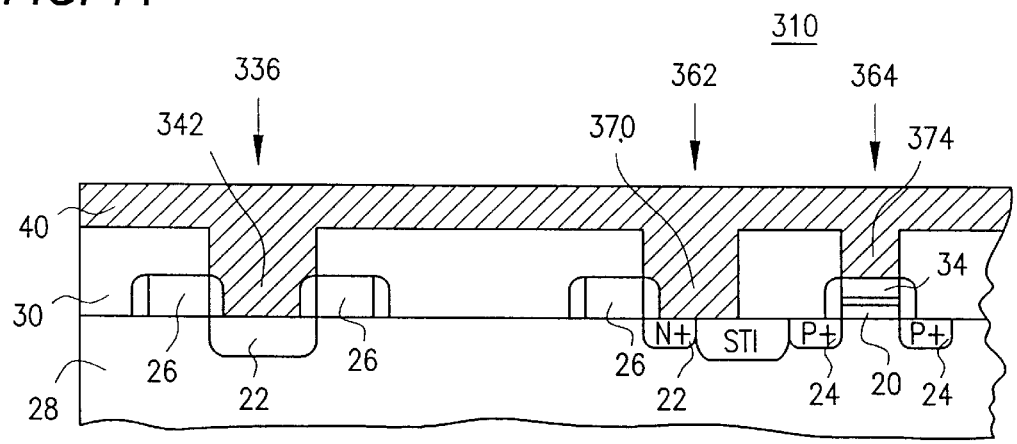
FIG. 14 is a cross-sectional view of a wafer undergoing the process of the third embodiment of the invention.

Referring now to FIG. 14, a photoresist (not shown) and mask (not shown) are applied to a protective layer 30, and photolithographic techniques are used to define areas to be etched-out. A directional etching process is used to etch through the protective layer 30 to form plug openings 336, 362, and 364. The bottom of plug opening 336 is an exposed active area of a first conductivity type 22, while the bottom of plug opening 362 is exposed n-type silicon source or drain areas 28, and the bottom of plug opening 364 is the protective cap 34 of the gate interconnect 20. The etchant used may be any suitable etchant that is selective for the material of the protective layer 30 relative to the material of the protective cap 34.

The resist (not shown) is then removed, and a first conductive layer 40 is formed so that it overlies the protective layer 30 and also fills plug openings 336, 362, and 364 to form plugs 342, 370 and 374. The first conductive layer 40 may be formed from refractory metal, such as tungsten, or may be formed of doped polysilicon. If the conductive layer 40 is formed of doped polysilicon, the layer 40 may be doped after deposition, but preferably is doped in-situ.

Figure 15:
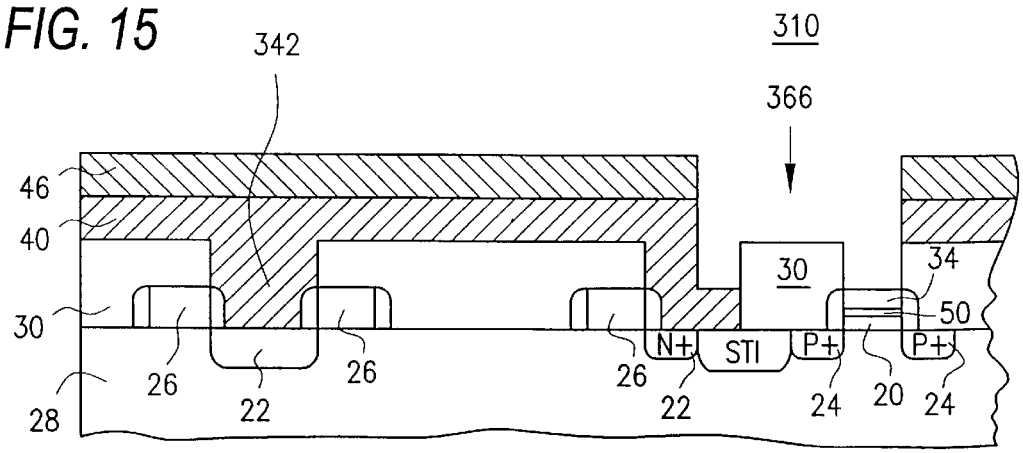
FIG. 15 shows the wafer of FIG. 14 at a processing step subsequent to that shown in FIG. 14.

As shown in FIG. 15, a second photoresist 46 and mask (not shown) are applied, and photolithographic techniques are used to define areas to be etched-out. In this step, portions of the first conductive layer 40 and the protective layer 30 are removed to join the plug openings 362 and 364 into a larger plug opening 366. A second etch is then performed to remove the cap layer 34 of the gate interconnect 20, exposing the gate layer 50.

Figure 16:
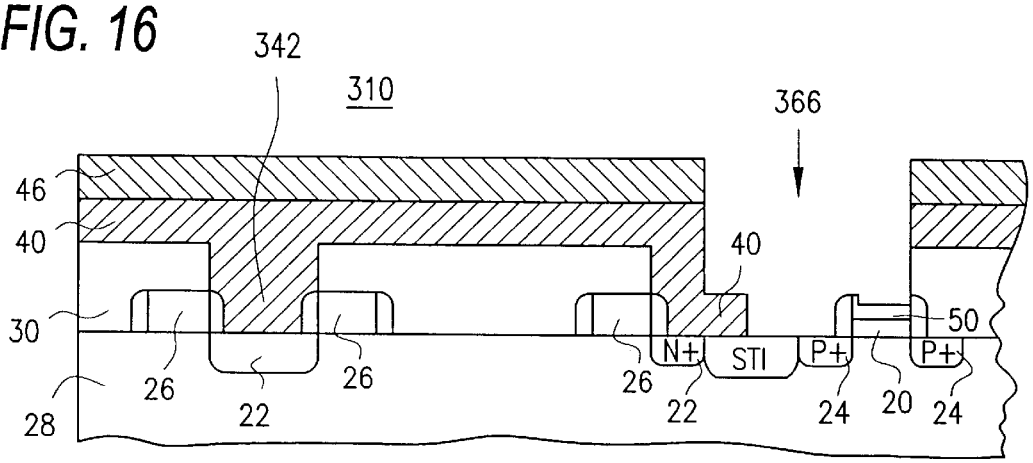
FIG. 16 shows the wafer of FIG. 14 at a processing step subsequent to that shown in FIG. 15.

Referring now to FIG. 16, a third etch is then performed to remove a portion of the protective layer 30 at the bottom of plug opening 366 to expose the p-type silicon source or drain areas and STI field oxide 28. The bottom of plug opening 366 now comprises a portion of the first conductive layer 40, a portion of exposed p-type silicon source or drain areas 28, and the gate layer 50 of the gate interconnect 20. The resist 46 is removed, and a barrier layer 376 is formed so that it overlies the first conductive layer 40, and also coats the interior surfaces of plug opening 366 to form a thin film. The barrier layer 376 may be comprised of titanium nitride or other suitable material, and is formed by CVD or other suitable process.

Figure 17:
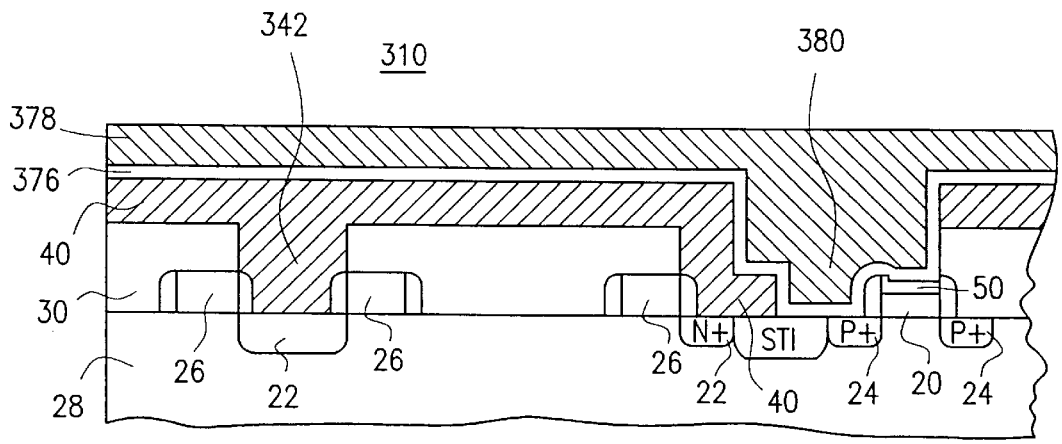
FIG. 17 shows the wafer of FIG. 14 at a processing step subsequent to that shown in FIG. 16.

As shown in FIG. 17, a second conductive layer 378 is then formed so that it overlies the barrier layer 376, and also fills the plug opening 366 to form plug 380. The second conductive layer 378 may be formed from suitable conductive materials such as a refractory metal or doped polysilicon, but is preferably tungsten. If the layer 378 is formed of doped polysilicon, the layer 378 may be doped after deposition, but preferably is doped in-situ. Barrier layer 376 and second conductive layer 378 may be deposited by any suitable means such as CVD.

The second conductive layer 378 is again formed from a material having a conductivity opposite that of the first conductive layer 40. If the first conductive layer 40 is n-doped polysilicon, the second conductive layer 378 could be formed from p-doped polysilicon, a refractory metal, or n-doped polysilicon having a barrier film.

Figure 18:
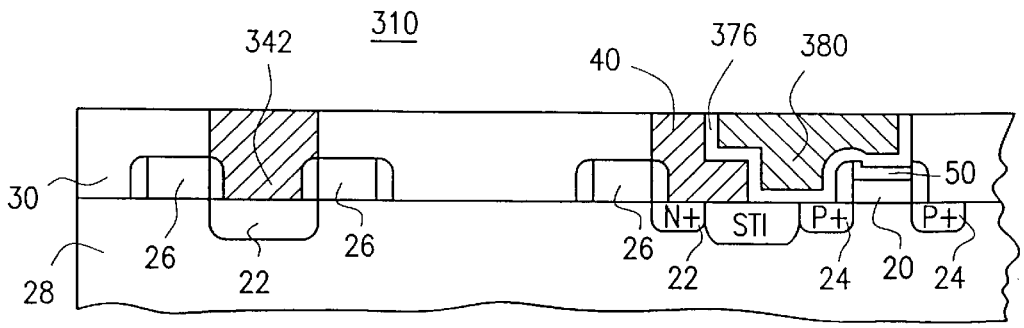
FIG. 18 shows the wafer of FIG. 14 at a processing step subsequent to that shown in FIG. 17.

The surface of the semiconductor device 310 is then planarized, by a method such as CMP, to remove the conductive layers 40, 378 and to isolate the plugs 342, 380. Other means of isolating the plugs such as a blanket etch-back may be used. The final structure of the semiconductor device 310 is shown in FIG. 18. Further steps to create a functional circuit from the device 310 may now be carried out.

As can be seen by the embodiments described herein, the present invention encompasses processes of forming conductive plugs of different conductive materials with a minimum of photolithography steps. All of the embodiments require at the most two photolithography and masking steps, which may be overlapping. As semiconductor structure sizes continue to shrink and multi-level devices became more common, further applications of the present invention to produce vertical connections or structures are foreseen.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method of fabricating conductive plugs in an array of DRAM cells comprising the steps of:

provinding a silicon substrate with at least one gate interconnect including a protective cap overlying a gate layer, active areas of a first and a second conductivity type, and at least one word line;

forming a protective layer atop said substrate;

defining at least one set of first and second plug openings in said protective layer, wherein said first opening outwardly exposes the active area of the first conductivity type, and wherein said second opening outwardly exposes the protective cap of said gate interconnect;

forming a first doped polysilicon layer of the first conductivity type on the surface of the protective layer of a depth at least sufficient to fill the first and the second plug openings;

defining at least one third plug opening in said protective layer and said first doped polysilicon layer, wherein said third opening outwardly exposes the active area of the second conductivity type;

redefining the second plug opening in said protective layer and said first doped polysilicon layer to outwardly expose the gate layer of said gate interconnect, and wherein the steps of defining the third plug opening and redefining the second plug opening are conducted simultaneously;

forming a second doped polysilicon layer of the second conductivity type on the surface of the first doped polysilicon layer of a depth at least sufficient to fill the second and the third plug openings;

isolating the first doped polysilicon layer in the first plug opening, and the second doped polysilicon layer in the second and third plug openings to form isolated conductive plugs in each plug opening, wherein said isolating step comprises chemical mechanical polishing to expose the protective layer; and forming at least one capacitor atop the protective layer and the conductive plugs.

* * * * *